United States Patent
Shibata

(10) Patent No.: US 10,338,129 B2
(45) Date of Patent: Jul. 2, 2019

(54) DETERIORATION DETECTION DEVICE FOR PRINTED CIRCUIT BOARD

(71) Applicant: FANUC CORPORATION, Yamanashi (JP)

(72) Inventor: Yukio Shibata, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/477,650

(22) Filed: Apr. 3, 2017

(65) Prior Publication Data

US 2017/0292989 A1 Oct. 12, 2017
US 2018/0128870 A9 May 10, 2018

(30) Foreign Application Priority Data

Apr. 4, 2016 (JP) .................................. 2016-075350

(51) Int. Cl.
*G01R 31/28* (2006.01)

(52) U.S. Cl.
CPC .............................. *G01R 31/2817* (2013.01)

(58) Field of Classification Search
CPC ............ G01R 31/2817; G01R 31/2896; G01R 31/2853; G01R 31/2808; G01R 31/2812; G01R 31/2801; G01R 31/2818; G01R 31/025; H05K 1/0268; H05K 1/181; H05K 1/0272

See application file for complete search history.

(56) References Cited

U.S. PATENT DOCUMENTS

| 5,457,390 A | 10/1995 | Peterson et al. | |
|---|---|---|---|
| 2014/0152449 A1* | 6/2014 | Klein | H05K 1/0268 340/662 |
| 2015/0066399 A1* | 3/2015 | Kasai | G01R 31/14 702/58 |
| 2015/0145552 A1* | 5/2015 | Korpela | G01R 31/2812 324/763.01 |

(Continued)

FOREIGN PATENT DOCUMENTS

| JP | S63-165577 U | 10/1988 |
|---|---|---|
| JP | H3-158748 A | 7/1991 |

(Continued)

OTHER PUBLICATIONS

Office Action in JP Application No. 2016-075350, dated May 8, 2018, 8 pp.

*Primary Examiner* — Thang X Le

(74) *Attorney, Agent, or Firm* — Hauptman Ham, LLP

(57) ABSTRACT

A deterioration detection device for a printed circuit board includes a monitoring conductor and a voltage supply conductor for supplying voltage/current arranged on the printed circuit board with an arbitrary clearance. A voltage Vx is applied to the voltage supply conductor at a plurality of points. A voltage (0 V) lower than the voltage Vx for the voltage supply conductor is applied to the monitoring conductor through a resistor. An amplifier circuit amplifies a voltage Vy for the monitoring conductor and outputs an output voltage Vout. If the printed circuit board is deteriorated and an insulation resistance Ry between the monitoring conductor and the voltage supply conductor is reduced, the output voltage Vout increases, so that deterioration of the printed circuit board can be detected.

14 Claims, 8 Drawing Sheets

(56) References Cited

U.S. PATENT DOCUMENTS

| | | | |
|---|---|---|---|
| 2015/0219713 A1 | 8/2015 | Aoyama et al. | |
| 2016/0054373 A1* | 2/2016 | Kasai | G01R 31/14 |
| | | | 324/551 |
| 2017/0013709 A1* | 1/2017 | Matsumoto | H05K 1/0268 |

FOREIGN PATENT DOCUMENTS

| | | |
|---|---|---|
| JP | H6-94799 A | 4/1994 |
| JP | H8-262094 A | 10/1996 |
| JP | H9-46010 A | 2/1997 |
| JP | H9-330969 A | 12/1997 |
| JP | 1062476 A | 3/1998 |
| JP | H10-239374 A | 9/1998 |
| JP | H11-211684 A | 8/1999 |
| JP | 2001-174489 A | 6/2001 |
| JP | 2001251026 A | 9/2001 |
| JP | 2001-358429 A | 12/2001 |
| JP | 2002-286780 A | 10/2002 |
| JP | 2009264989 A | 11/2009 |
| JP | 2011-253849 A | 12/2011 |
| JP | 2013-83462 A | 5/2013 |
| JP | 2015-145864 A | 8/2015 |
| JP | 2015-227804 A | 12/2015 |

* cited by examiner

DETERIORATION DETECTION DEVICE FOR PRINTED CIRCUIT BOARD

RELATED APPLICATIONS

The present application claims priority to Japanese Application Number 2016-075350 filed Apr. 7, 2016, the disclosure of which is hereby incorporated by reference herein in its entirety.

BACKGROUND OF THE INVENTION

Field of the Invention

The present invention relates to a deterioration detection device for detecting deterioration of a printed circuit board used in a variety of electronic devices.

Description of the Related Art

If the tightness (airtightness) of a case body accommodating a printed circuit board used for a variety of electronic devices is poor, water (condensed dew in particular), cutting fluid, corrosive liquid or the like (hereinafter referred to as the electrically conductive material) penetrates and corrodes a pattern (including vias) of the printed circuit board. If the humidity is high (due to dew condensation in particular), it causes electrolytic corrosion in spite of the tightness (air tightness) of the case body. Thus, the printed circuit board is deteriorated by its surrounding environment, possibly causing a malfunction.

Thereupon, in a generally known method for detecting the deterioration of the printed circuit board, the printed circuit board is provided with a conductor/wiring pattern for deterioration detection formed of a conductor/wiring pattern susceptible to deterioration such that the deterioration of the printed circuit board can be detected on the basis of the deterioration of the conductor/wiring pattern.

For example, Japanese Patent Application Laid-Open No. 2001-251026 describes an invention in which a pattern with a width narrower than those of other wiring patterns or a pattern with a shorter insulation distance is provided as a conductor/wiring pattern for deterioration detection so that breakage due to corrosion or short-circuiting due to migration or the like is surer to first occur than in the case of other patterns. According to this arrangement, deterioration of a printed circuit board can be detected by detecting the deterioration (breakage or short-circuiting) of the conductor/wiring pattern for deterioration detection.

Moreover, Japanese Patent Application Laid-Open No. 2009-264989 describes an invention in which a printed circuit board is provided with two opposite conducting members for deterioration detection, one of which is connected to the ground and the other of which is connected to a voltage application circuit through a resistor. As an insulation resistance between the two conducting members for deterioration detection changes depending on the humidity and the amount of dust deposited on the printed circuit board, according to this arrangement, deterioration of the printed circuit board can be detected by detecting a reduction in the insulation resistance between the two conducting members for deterioration detection and producing an abnormality signal based on the frequency of such a reduction.

Furthermore, Japanese Patent Application Laid-Open No. 10-62476 discloses an invention in which a pattern for deterioration detection is provided on a printed board of a deterioration detection device so as to be exposed to the atmosphere and a constant current is drawn from a power source VCC through a resistor. Based on this, an A/D converter detects the voltage across the pattern and a determination circuit periodically analyzes the detected voltage. If the pattern is corroded and made thinner, the detected voltage of the A/D converter increases. Therefore, if the detected voltage exceeds a threshold, the determination circuit informs a display circuit to that effect, whereupon the display circuit displays a warning or sounds a buzzer. In response to this warning, an operator is expected to maintain or replace a printed board.

According to the conventional method of printed circuit board deterioration detection, the conductor/wiring pattern for monitoring the state of deterioration may be broken or deteriorated, so that the printed circuit board cannot easily be reused once the deterioration is detected.

SUMMARY OF THE INVENTION

Accordingly, the object of the present invention is to provide a printed circuit board deterioration detection device capable of reusing a printed circuit board mounted with components including a printed circuit board, with little or no deterioration a conductor/wiring pattern for monitoring the state of deterioration.

A printed circuit board deterioration detection device according to the present invention for detecting deterioration of a printed circuit board in an electronic device comprises a deterioration state detection means, including a monitoring conductor for detecting deterioration and a voltage supply conductor for supplying voltage/current arranged on the printed circuit board with an arbitrary clearance, the voltage supply conductor is applied a given voltage from a plurality of points, the monitoring conductor is applied a voltage lower than that applied to the voltage supply conductor, and a variation of the voltage from the monitoring conductor is detected as an output signal indicative of a deterioration state of the printed circuit board, and a deterioration determination detection means configured to determine and detect the deterioration of the printed circuit board, based on the output of the deterioration state detection means, and output a deterioration detection signal.

In the printed circuit board deterioration detection device, the voltage supply conductor is connected to any given voltage/current source at a plurality of points, and the monitoring conductor is supplied with a voltage lower than that of the voltage/current source through one or more resistors.

In the printed circuit board deterioration detection device, the voltage connected to the monitoring conductor through the resistors is 0 V.

In the printed circuit board deterioration detection device, resists covering the monitoring conductor and the voltage supply conductor are partially or wholly omitted. Moreover, in the printed circuit board deterioration detection device, the resists and the circuit board are brought into close contact with one another at conductor-free parts formed by removing the material of the conductors at the parts under the resists covering the monitoring conductor and the voltage supply conductor.

In the printed circuit board deterioration detection device, the deterioration state detection means comprises one or more amplifier circuits connected to the monitoring conductor such that an output or outputs of the amplifier circuit or circuits are regarded as the output of the deterioration state detection means.

Moreover, in the printed circuit board deterioration detection device, the plurality of amplifier circuits connected to the monitoring conductor are set with different amplification degrees. Furthermore, in the printed circuit board deterioration detection device, the voltage/current source for supplying the voltage/current to the voltage supply conductor comprises a voltage/current supply circuit configured to stop the voltage/current supply for a predetermined time period when the deterioration detection signal is detected.

In the printed circuit board deterioration detection device, a third conductor doubling as the monitoring conductor and the voltage supply conductor is arranged, in addition to the monitoring conductor and the voltage supply conductor, on the printed circuit board with an arbitrary clearance from the monitoring conductor, and the monitoring conductor and the third conductor are connected to each other to have the same voltage in such a manner that the monitoring conductor and the third conductor are allowed to be disconnected upon deteriorated the voltage supply conductor from each other to allow a voltage applied to the voltage supply conductor to be connected to the third conductor, thereby constituting the deterioration state detection means.

A printed circuit board deterioration detection device according to the present invention for detecting deterioration of a printed circuit board in an electronic device comprises a deterioration state detection means, including a voltage receiving conductor and a monitoring/voltage supply conductor arranged on the printed circuit board with an arbitrary clearance, the monitoring/voltage supply conductor doubles as a monitoring conductor for detecting deterioration and a voltage supply conductor for supplying voltage/current, the voltage receiving conductor is connected to a given voltage/current source, the monitoring/voltage supply conductor is divided into a plurality of conductors, each of which is supplied with a voltage higher than the voltage/current source through a resistor, and a variation of the voltage from the monitoring/voltage supply conductor is detected as an output signal indicative of a deterioration state of the printed circuit board, and a deterioration determination detection means configured to determine and detect the deterioration of the printed circuit board, based on the output of the deterioration state detection means, and output a deterioration detection signal.

The printed circuit board deterioration detection device is configured so that the deterioration determination detection means comprises a comparator circuit configured to output the deterioration detection signal if an output voltage from the deterioration state detection means is deviated from a reference voltage range. Moreover, in the printed circuit board deterioration detection device, if the deterioration state detection means comprises a plurality of amplifier circuits, the deterioration determination detection means comprises comparator circuits connected individually to the amplifier circuits of the deterioration state detection means, and each of the comparator circuits compares an output voltage of the amplifier circuit connected thereto and a reference voltage and outputs the deterioration detection signal if the output voltage is deviated from a reference voltage range.

In the printed circuit board deterioration detection device, the deterioration determination detection means reads an output voltage Vout of the deterioration state detection means and a current time Tr at each predetermined time interval or at each predetermined timing, obtains a time-based variation Vout' of the output voltage based on a time duration from the start of use of the printed circuit board and differences between previously and currently read output voltages and times, and outputs a resulting detection signal based on a combination of the magnitudes of factors for determining the deterioration state of the printed circuit board, including the time-based variation Vout' of the output voltage, the read output voltage Vout, and the duration from the start of use.

In the printed circuit board deterioration detection device, the deterioration determination detection means comprises a means for reading the output voltage Vout of the deterioration state detection means and the current time Tr at each predetermined time interval or at each predetermined timing, a means for obtaining a duration TI from the start of use from the read current time and a preset use start time of the printed circuit board, a means for calculating an elapsed time $\Delta T$ from previous reading from the read current time and the previously read time stored in a storage unit, a means for obtaining a difference voltage $\Delta V$ between the read output voltage Vout and a previously read output voltage Vb stored in the storage unit, a means configured to obtain a time-based variation Vout' of the output voltage by dividing the difference voltage $\Delta V$ by the elapsed time $\Delta T$, storage unit is configured to individually store the read output voltage Vout and the current time Tr, a voltage comparison/determination unit configured to compare/determine the read output voltage Vout and a preset reference voltage value, a duration comparison/determination unit configured to compare/determine the duration TI from the start of use and a preset reference duration, a voltage variation comparison/determination unit configured to compare/determine the time-based variation Vout' of the output voltage and a preset reference variation, and a means for outputting a deterioration detection signal based on a combination of the results of determination by the individual comparison/determination means.

The printed circuit board deterioration detection device comprises an alarm output means for outputting an alarm or a message depending on the type of the deterioration detection signal.

Each of the printed circuit board deterioration detection devices according to the present invention is configured so that a deterioration state of a printed circuit board can be detected and the printed circuit board and a printed board mounted with components including the printed circuit board can be reused after it is partially or wholly cleaned (hereinafter referred to as "the printed circuit is cleaned" or "the printed board cleaning") even if a conductor for detecting deterioration of the printed circuit board is damaged and cut off.

BRIEF DESCRIPTION OF THE DRAWINGS

The above and other objects and features of the present invention will be obvious from the ensuing description of embodiments with reference to the accompanying drawings, in which.

DETAILED DESCRIPTION OF THE PREFERRED EMBODIMENTS

Embodiments of the present invention will now be described with reference to the accompanying drawings.

Figure 1A:
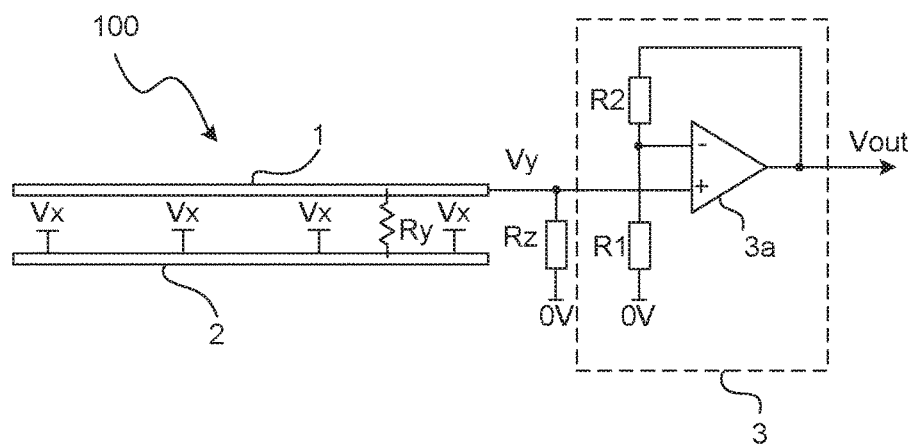
FIG. 1A is a schematic diagram of the first embodiment of a deterioration state detection means of a printed circuit board deterioration detection device of the present invention (example in which a single resistor Rz is connected)
Figure 1B:
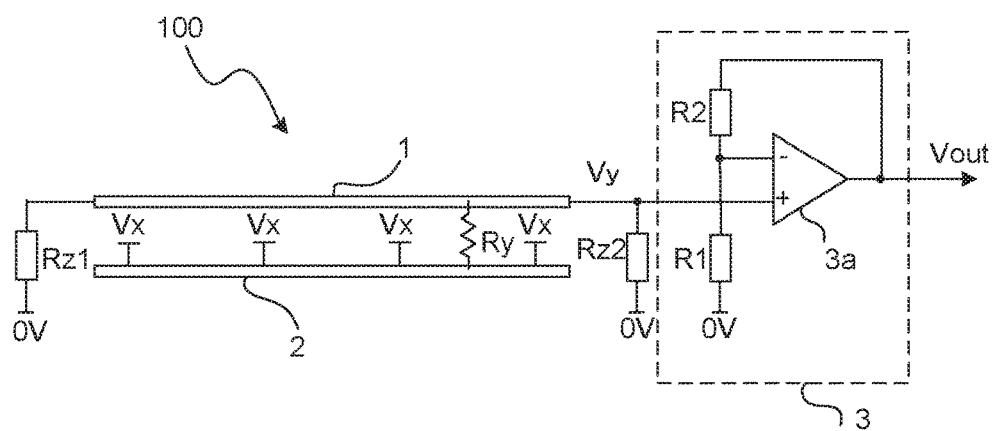
FIG. 1B is a schematic diagram of the first embodiment of the deterioration state detection means of the printed circuit board deterioration detection device of the present invention (example in which two resistors Rz1 and Rz2 are connected)

FIG. 1A and FIG. 1B are schematic diagrams of the first embodiment of a deterioration state detection means 100 for detecting a signal indicative of a deterioration state of a printed circuit board, in a printed circuit board deterioration detection device of the present invention. The deterioration state detection means 100 comprises a monitoring conductor 1 for detecting deterioration and a voltage supply conductor 2 for supplying voltage/current. These conductors 1 and 2 are mounted on the printed circuit board with an arbitrary clearance so as not to contact with each other. The monitoring conductor 1 is initially held at 0 V via a resistor, while the voltage supply conductor 2 is set to maintain a given voltage Vx (Vx>0 V). One or more resistors for applying the voltage of 0 V to the monitoring conductor 1 are connected in an arbitrary position or positions. FIG. 1A shows an example in which a single resistor Rz is connected, and FIG. 1B shows an example in which two resistors Rz1 and Rz2 are connected. The one or more resistors for applying the voltage to the monitoring conductor 1 are connected depending on the length of the monitoring conductor 1, the presence of noise, or the possibility of breakage of the monitoring conductor 1. If the breakage of the monitoring conductor 1 is presumable, only one resistor should preferably be used to apply the voltage to the monitoring conductor 1.

The voltage supply conductor 2 is connected to the voltage/current source of the voltage Vx (any given voltage) at one or more points thereof. In the case of the first embodiment shown in FIG. 1A and FIG. 1B, the voltage Vx is applied to the voltage supply conductor 2 at four points. The monitoring conductor 1 is connected with a non-inverting amplifier circuit (hereinafter referred to as "amplifier circuit") 3, which comprises an amplifier (hereinafter referred to as "OP amplifier") 3a and resistors R1 and R2 (the monitoring conductor 1 is connected to a plus terminal of the OP amplifier 3a).

The voltage of the monitoring conductor 1 is lower than that of the voltage supply conductor 2, so that the monitoring conductor 1 forms a cathode and the voltage supply conductor 2 forms an anode. Under the presence of electrically conductive material, the voltage supply conductor 2 i.e. the anode is of higher voltage and is deteriorated earlier, while the monitoring conductor 1 i.e. the cathode is hardly deteriorated or can be reduced in its deterioration. Thus, upon detected the deterioration of the printed circuit board, the function of the deterioration detection state detection means can be recovered by cleaning the printed circuit board to remove the electrically conductive material, so that it can be used as the printed circuit board again. (If the deterioration of the printed circuit board is to be detected on the voltage of the voltage supply conductor 2 on the anode side, the voltage supply conductor 2 is deteriorated earlier as the anode the printed board cannot be reused. Moreover, the deterioration is conventionally detected with both the anode- and cathode-side conductors in a set, so that the reuse is difficult if either of the conductors is deteriorated.) In the drawings, Ry denotes a resistance component brought about through the electrically conductive material between the monitoring conductor 1 and the voltage supply conductor 2.

The monitoring conductor 1 and the voltage supply conductor 2 may be arranged on any parts of the printed circuit board and their lengths, configurations, shapes and the like may be freely selected. (For example, the conductors may be located on the entire circumference (all the four sides) or one, two, or three horizontal or vertical sides of the printed circuit board. The conductors may be located in the center of the printed circuit board, not around the same. They may be either straight or curved.)

Resists that cover the surfaces of the monitoring conductor 1 and the voltage supply conductor 2 may be wholly or partially omitted or left whole. In FIG. 1A and FIG. 1B, the surfaces of the monitoring conductor 1 and the voltage supply conductor 2 are assumed to be wholly or partially exposed and are represented by empty squares. The conductors covered by the resists are represented by thin lines.

Figure 2A:
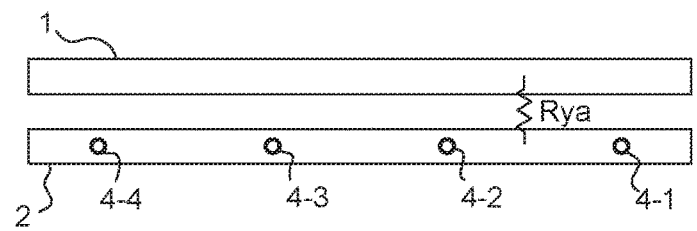
FIG. 2A is an explanatory diagram showing one of various forms of a voltage supply conductor.

FIG. 2A is an explanatory diagram illustrating the connection of the voltage Vx for the voltage supply conductor 2 to the voltage/current sources. The voltage supply conductor 2 is adapted to be connected to a source for the voltage Vx in an inner layer of the printed circuit board by vias 4, that is, by first to fourth vias 4-1 to 4-4 in the example shown in FIG. 2A.

Figure 2B:
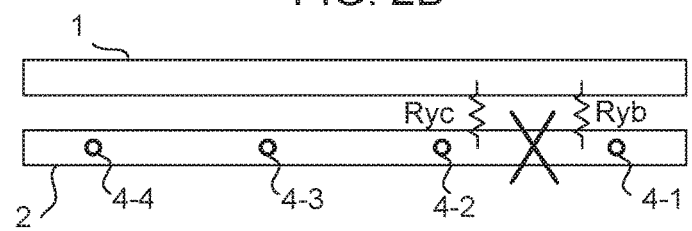
FIG. 2B is an explanatory diagram showing one of various forms of the voltage supply conductor (case in which the voltage supply conductor is broken)

The resistance component Ry of FIG. 1A and FIG. 1B brought about through the electrically conductive material is shown in FIG. 2A as a resistance component Rya based on the electrically conductive material. In FIG. 2B, symbol x indicates a case in which the voltage supply conductor 2 is broken by the resistance component Rya. Despite this breakage, if the resistance component Ryb based on the electrically conductive material is newly formed, as shown in FIG. 2B, voltage/current is supplied from the first via 4-1 to the monitoring conductor 1 through the voltage supply conductor 2 and a resistance component Ryb. Moreover, if a resistance component Ryc brought about through the electrically conductive material is newly formed, voltage/current is supplied from the second to fourth vias 4-2 to 4-4 to the monitoring conductor 1 through the voltage supply conductor 2 and the resistance component Ryc. Thus, even if the voltage supply conductor 2 had broken, the function of the means for deterioration detection can be retained and it can be reused as the printed circuit board. In the prior art examples, when the voltage supply conductor 2 is broken (or when electrical properties before the breakage are changed), the breakage is detected and the printed board is replaced. Thus, it is difficult to reuse the printed board before the replacement.

Figure 2C:
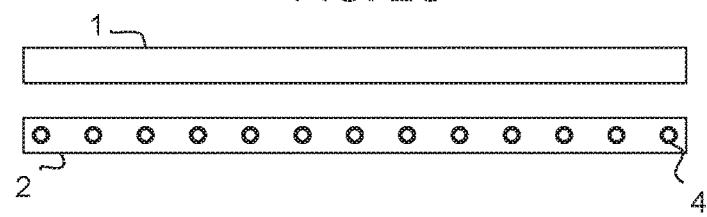
FIG. 2C is an explanatory diagram showing one of various forms of the voltage supply conductor (example in which a plurality of vias are provided)

If the part of the voltage supply conductor 2 between vias 4-$n$ and 4-($n$−1) ($2 \leq n \leq 4$) is broken at two points, as in FIG. 2B, the voltage/current cannot be supplied from thus formed fragment between two broken points to the monitoring conductor 1 even though the resistance component brought about through the electrically conductive material is formed. However, the fragment in which the voltage/current cannot be supplied can be reduced in its size by providing a plurality of vias 4 connecting the inner layer and the voltage supply conductor 2, as shown in FIG. 2C.

Figure 2D:
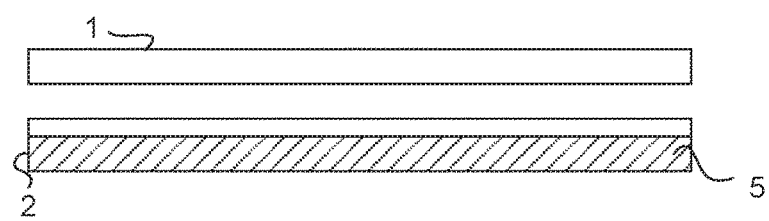
FIG. 2D is an explanatory diagram showing one of various forms of the voltage supply conductor (case in which the voltage supply conductor is covered by a resist)

Moreover, if the width dimension of the voltage supply conductor 2 can be increased, the breakage can be reduced by forming a part of the voltage supply conductor 2 as a conductor covered by a resist 5, as shown in FIG. 2D. (Thus, the number of vias can be reduced.)

Figure 2E:
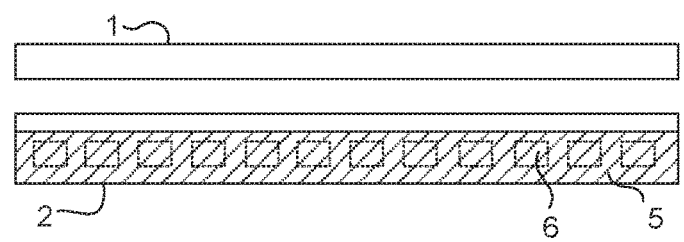
FIG. 2E is an explanatory diagram showing one of various forms of the voltage supply conductor (case in which the voltage supply conductor is provided with a conductor-free part)

Although the resist 5 prevents an attack on the conductor from above the electrically conductive material in the state shown in FIG. 2D, the effect of the resist 5 to prevent a lateral attack on the conductor relative to the electrically conductive material is little, since the resist 5 merely lies on the conductor. FIG. 2E shows an example in which the lateral attack relative to the electrically conductive material is reduced, and more specifically, a conductor-free part 6 is formed in the middle of the conductor width so that the resist 5 and the circuit board are in close contact with each other, whereby the lateral attack is further reduced. The concept of FIGS. 2D and 2E is also applicable to the monitoring conductor 1.

If the resistances of the monitoring conductor 1 and the voltage supply conductor 2 and the bias current of the OP amplifier are ignored, in the example of FIG. 1A and FIG. 1B, a voltage Vy applied to the amplifier circuit 3 can be given by $$Vy = Vx \cdot R/(R+Ry) \tag{1}$$

Here R corresponds to Rz in FIG. 1A, represents a combined resistor formed of a parallel circuit of the resistors Rz1 and Rz2 in FIG. 1B, and is given by $R = Rz1 \cdot Rz2/(Rz1+Rz2)$. (If three or more resistors are used, R is a combined resistor comprising them.)

According to equation (1), the resistance component Ry based on the electrically conductive material between the monitoring conductor 1 and the voltage supply conductor 2 can be expressed as follows:

$$Ry = R \cdot (Vx - Vy)/Vy \tag{2}$$

An output voltage Vout of the amplifier circuit 3 can be expressed by equation (3) as follows:

$$Vout = (1 + (R2/R1)) \cdot Vy \tag{3}$$

According to equation (3), the voltage Vy, which is the voltage of the monitoring conductor 1 to be input to the amplifier circuit 3, can be expressed by equation (4) as follows:

$$Vy = \{R1/(R1+R2)\} \cdot Vout \tag{4}$$

If the electrically conductive material adheres to the printed circuit board, thereby deteriorating it, the insulation resistance Ry between the monitoring conductor 1 and the voltage supply conductor 2 is reduced, and the reduction of the resistance Ry results in an increase in the voltage Vy of the monitoring conductor 1 according to equation (1). Thus, the voltage Vy of the monitoring conductor 1 becomes the signal indicative of the deterioration state of the printed circuit board. This voltage Vy, as the signal indicative of the deterioration state of the printed circuit board, is input to the amplifier circuit 3 of the deterioration state detection means 100. Moreover, the voltage Vy of the monitoring conductor 1 (to be input to the amplifier circuit 3) can be ascertained if the output voltage Vout of the amplifier circuit 3 is kept being monitored according to equation (4). If the resistance R1 is made infinitely large (or if R1 is not connected), Vout=Vy is given. Thus, if the output voltage Vout of the amplifier circuit 3 is monitored, then the voltage Vy of the monitoring conductor 1, and hence, the deterioration of the printed circuit board, will be monitored.

The voltage Vy of the monitoring conductor 1 is 0 V at the first stage when the use of the printed circuit board is started. If the insulation resistance between the monitoring conductor 1 and the voltage supply conductor 2 is reduced by the electrically conductive material, however, the voltage Vy of the monitoring conductor 1, that is, the input voltage of the amplifier circuit 3, increases. This increase of the voltage Vy results in an increase in the output voltage Vout of the amplifier circuit 3, as is evident from equation (3). Thus, if the output voltage Vout of the amplifier circuit 3 is kept being monitored, it can be detected that the insulation resistance between the monitoring conductor 1 and the voltage supply conductor 2 is reduced by the electrically conductive material so that the printed circuit board is deteriorated.

According to the present invention, the output voltage Vout of the amplifier circuit 3 is monitored, and an alarm is output depending on the level of the output voltage Vout (the level of the resistance Ry between the monitoring conductor 1 and the voltage supply conductor 2 and the level of the voltage Vy of the monitoring conductor 1). When this alarm is output, the printed board is made reusable by taking measures such as cleaning it for reuse or replacing it and cleaning the printed board before the replacement. Even in the case where the voltage supply conductor 2 is broken, as shown in FIG. 2B, the voltage Vx is supplied to the voltage supply conductor 2 through the plurality of vias 4 to maintain the function as the deterioration state detection means. Thus, the printed board can be reused, and in addition, the deterioration detection function can be maintained, by removing the electrically conductive material to increase the insulation resistance between the monitoring conductor 1 and the voltage supply conductor 2 through the printed board cleaning and the like (the expression "cleaning or the like" suggests the elimination of the cause of the short-circuit through any means other than "washing" in case the function of the printed circuit board cannot be restored by washing such as that happened in the case of short-circuit due for example to the migration; "cleaning and the like" will hereinafter be referred to as "cleaning").

Figure 3:
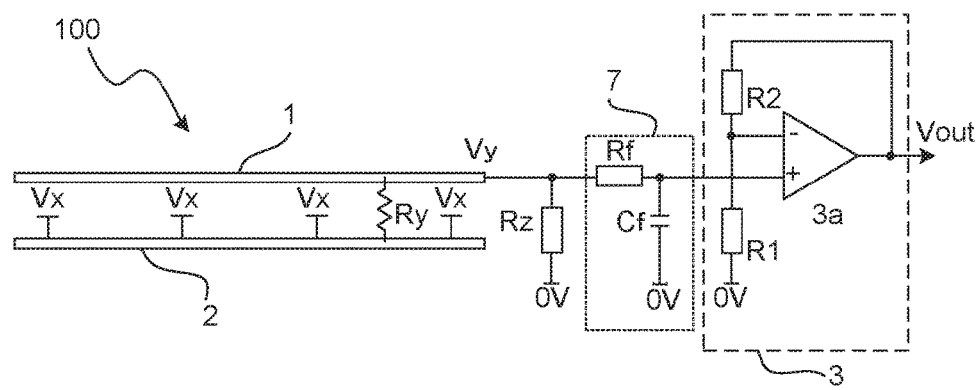
FIG. 3 is a schematic diagram of the second embodiment of the deterioration state detection means of the printed circuit board deterioration detection device of the present invention.

FIG. 3 is a schematic diagram of the second embodiment of the deterioration state detection means 100 in which a simple filter 7 formed of a resistor Rf and a capacitor Cf is added to the circuit of FIG. 1A (or the filter may be added to the circuit of FIG. 1B instead of FIG. 1A for the example shown in FIG. 3). If necessary, e.g., if noise is generated on the monitoring conductor 1, the filter 7 is provided at the input of the amplifier circuit 3 to remove the noise, as shown in FIG. 3.

Figure 4A:
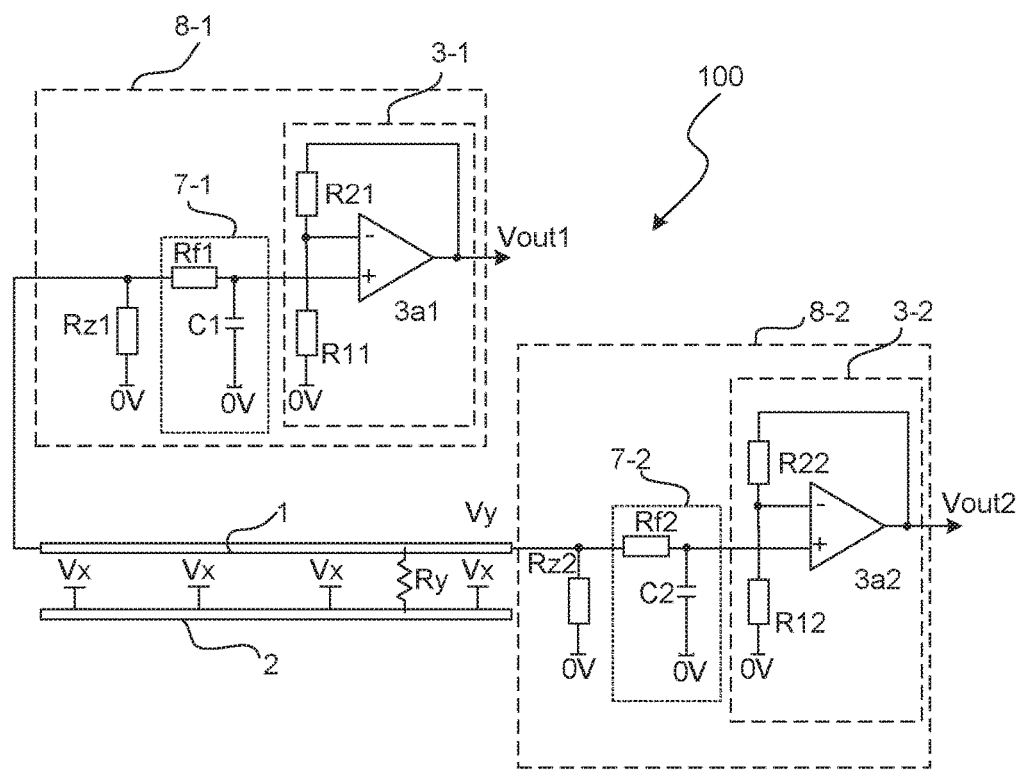
FIG. 4A is a schematic diagram of the third embodiment of the deterioration state detection means of the printed circuit board deterioration detection device of the present invention (example in which two amplifier circuits are connected to the monitoring conductor)
Figure 4B:
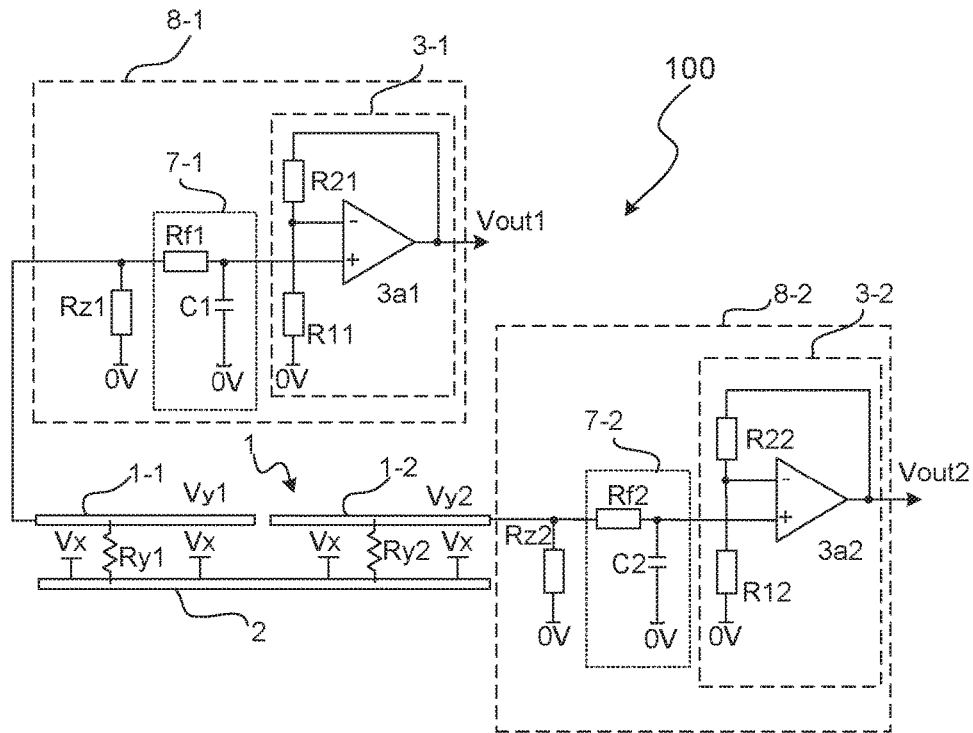
FIG. 4B is a schematic diagram of the third embodiment of the deterioration state detection means of the printed circuit board deterioration detection device of the present invention (example in which the monitoring conductor is divided into a plurality of conductors)

Although the single amplifier circuit 3 is connected to the monitoring conductor 1, in the first and second embodiments of the deterioration state detection means 100, a plurality of such amplifier circuits 3 may be connected on the monitoring conductor 1. FIG. 4A and FIG. 4B are schematic diagrams of the third embodiment of the deterioration state detection means 100. In this third embodiment, the amplifier circuit 3 with the filter 7 and the resistor that connecting the monitoring conductor 1 to 0 V are connected in set and two sets are connected to the monitoring conductor 1. Specifically, in FIG. 4A, two circuits, a first circuit 8-1 and a second circuit 8-2, are connected to the monitoring conductor 1. The first circuit 8-1 comprises an amplifier circuit 3-1 including resistors R11 and R21 and an OP amplifier 3a1, a filter 7-1 formed of a resistor Rf1 and a capacitor C1, and a resistor Rz1 that connects the monitoring conductor 1 to 0 V. The second circuit 8-2 comprises an amplifier circuit 3-2 formed of resistors R12 and R22 and an OP amplifier 3a2, a filter 7-2 formed of a resistor Rf2 and a capacitor C2, and a resistor Rz2 that connects the monitoring conductor 1 to 0 V. Output voltages Vout1 and Vout2 are assumed to be output from the first circuit 8-1 and the second circuit 8-2, respectively.

Thus connected plurality of amplifier circuits 3 different in their amplification degree can cover the broad range of variation of the voltage Vy of the monitoring conductor 1. (If the amplification degree is raised, although there are no problem when the voltage Vy is relatively low, the amplifier (OP amplifier) may possibly be saturated when the voltage Vy exceeds the limit defined by the amplification degree. By differentiating the amplification degrees of the individual amplifiers (OP amplifiers), the value of the voltage Vy can be obtained from the value of an unsaturated amplifier (OP amplifier) even if any of the amplifiers (OP amplifiers) is saturated. If there is any amplifier (OP amplifier) that is not saturated when the voltage Vy is substantially equal to the voltage Vx supplied to the voltage supply conductor 2, the value of the voltage Vy can be obtained even when the other amplifiers (OP amplifiers) are saturated.)

If there is a possibility of the monitoring conductor 1 being broken in such a manner that both the monitoring conductor 1 and the voltage supply conductor 2 are broken due to high corrosiveness, the monitoring conductor 1 may be divided into a plurality of monitoring conductors 1-1 and 1-2, and the sets of the amplifier circuit 3 with the filter 7 and the resistor connecting the monitoring conductor 1 to 0 V may be connected individually to the monitoring conductors, as shown in FIG. 4B. In such a structure, reuse can be achieved even if the monitoring conductors 1-1 and 1-2 are partially broken. In this case, only one resistor (resistor that connects the monitoring conductor 1 to 0 V) should be connected to each monitoring conductor 1. This is because when the monitoring conductors 1-1 and 1-2 are broken, the voltage of the monitoring conductor 1 changes if the resistors are connected to the tips of the broken resistors, and this makes the reuse of the detection means 100 difficult. (Although the monitoring conductor 1 is divided in two in the example of FIG. 4B, the breakage can be cope with by increasing the number of divisions if it is anticipated that the frequency of the breakage is apt to occur.)

Figure 5:
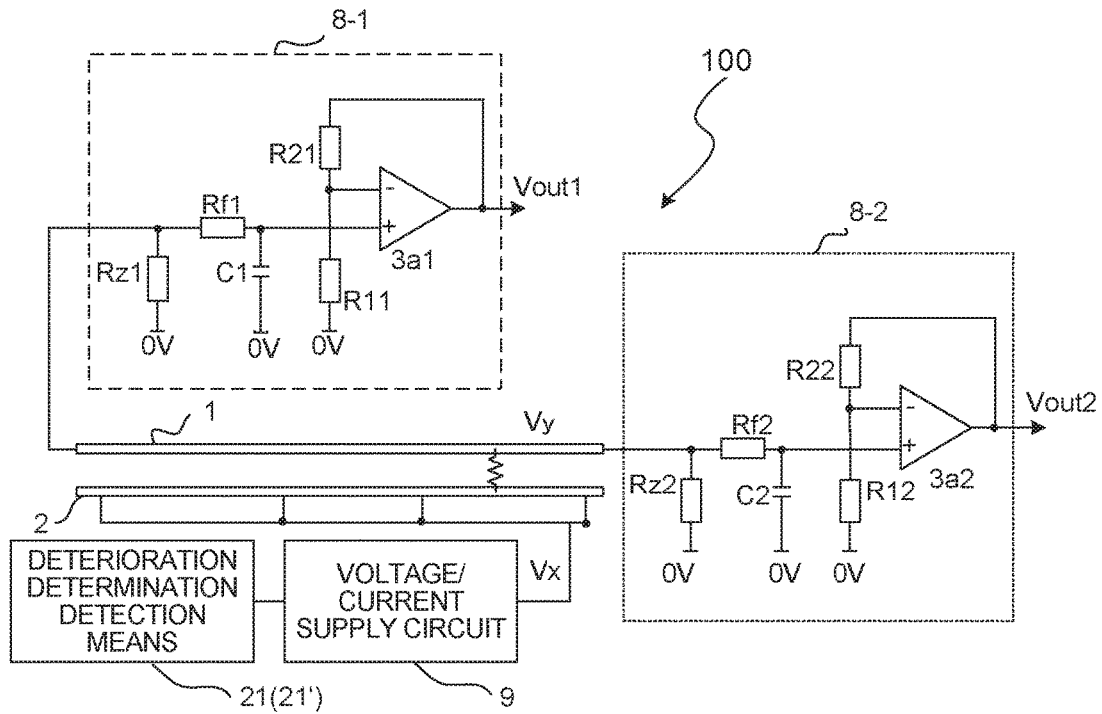
FIG. 5 is a schematic diagram of the fourth embodiment of the deterioration state detection means of the printed circuit board deterioration detection device of the present invention.

FIG. 5 is a schematic diagram of the fourth embodiment of the deterioration state detection means 100. In the printed circuit board deterioration detection device of the present invention, if the insulation resistance Ry between the monitoring conductor 1 and the voltage supply conductor 2 is reduced and deterioration abnormality of the printed circuit board is detected, an alarm is issued to promote cleaning or the like of the printed board, as described later. However, some machines configured for continuous operation, for example, cannot be stopped, so that the deterioration of the deterioration state detection means (monitoring conductor 1 and voltage supply conductor 2) inevitably progresses (e.g., the risk of the breakage of the voltage supply conductor 2 increases) if an operator or person in charge ignores or overlooks the alarm and continues to use the printed board without replacing or cleaning it. The fourth embodiment is configured to prevent the progress of the deterioration of the deterioration state detection means.

Figure 6:
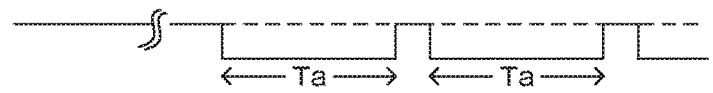
FIG. 6 is an operation explanatory diagram of a voltage/current supply circuit according to the fourth embodiment.

In the fourth embodiment, a voltage/current supply circuit 9 is added to the third embodiment described above so that the voltage Vx can be supplied from the voltage/current supply circuit 9 to the voltage supply conductor 2. Moreover, FIG. 6 is an explanatory diagram of the operation of the voltage/current supply circuit 9. The voltage/current supply circuit 9 can also be added to fifth and sixth embodiments described later, as well as to the first and second embodiments.

At the start of operation (power-on time) when the printed circuit board starts to operate, the voltage/current supply circuit 9 turns the output on (high level) to continuously supply the voltage/current to the voltage supply conductor 2. When a deterioration determination detection means 21 (described later) detects deterioration abnormality, the voltage/current supply circuit 9 turns the output off (low level), thereby shutoff the supply of the voltage Vx to the voltage supply conductor 2. After a predetermined time Ta had elapsed, the output is turned on again to resume the supply of the voltage Vx to the voltage supply conductor 2. When the voltage Vx is supplied to the voltage supply conductor 2, the output voltage Vout is output again from the amplifier circuit 3, whereupon the deterioration determination detection means 21 determines and checks the deterioration of the printed circuit board. When the state of the printed circuit board is not improved yet, a deterioration detection signal is output from the deterioration determination detection means 21, so that the voltage/current supply circuit 9 turns the output off to stop the supply of the voltage Vx to the voltage supply conductor 2 for the predetermined time Ta. Thereafter, this on-off operation (supply/stop of the voltage Vx) is repeatedly performed unless an abnormal state is eliminated. Once the deterioration detection signal indicative of deterioration abnormality is output, the voltage Vx is not supplied to the voltage supply conductor 2 for the predetermined time Ta during which the supply of the voltage Vx to the voltage supply conductor 2 is shutoff. Thus, the deterioration of the deterioration state detection means 100 due to electrolytic corrosion can be prevented from progressing.

The output (voltage Vx) of the voltage/current supply circuit 9 may be an output of a power supply circuit or an output of a general-purpose logic, custom LSI, CPU or any other device with a low power consumption that can deliver the voltage Vx. An on-off circuit that involves a shutoff time may be formed of a monostable multivibrator, CPU or any other device that can form the on-off operation circuit with a shutoff time.

Figure 7:
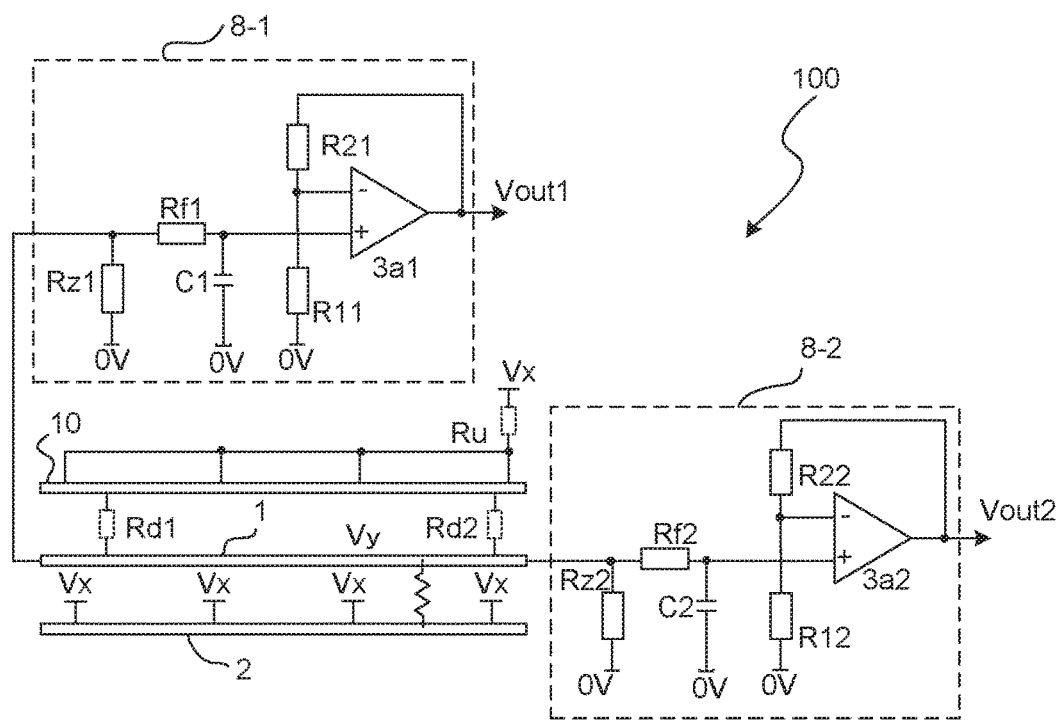
FIG. 7 is a schematic diagram of the fifth embodiment of the deterioration state detection means of the printed circuit board deterioration detection device of the present invention.

FIG. 7 is a schematic diagram of the fifth embodiment of the deterioration state detection means 100. In this fifth embodiment, a monitoring/voltage supply conductor 10 is provided in addition to the monitoring conductor 1 and the voltage supply conductor 2. The monitoring/voltage supply conductor 10 is arranged on the printed circuit board with an arbitrary clearance so as not to contact the monitoring conductor 1. The monitoring conductor 1 and the monitoring/voltage supply conductor 10 are connected with each other through one or more resistors of 0Ω so as not to produce a potential difference. Two resistors Rd1 and Rd2 are connected in the example shown in FIG. 7. Initially, a resistor Ru that connects the monitoring/voltage supply conductor 10 to the voltage/current source for the voltage Vx is not connected.

If the voltage supply conductor 2 becomes unusable due to deterioration by aging or the occurrence of abnormality, the two resistors Rd1 and Rd2 are disconncted and the resistor Ru of 0Ω is connected. Thereupon, the monitoring/voltage supply conductor 10 serves in place of the voltage supply conductor 2, so that the estimated usable period of the printed circuit board can be extended.

Although the monitoring conductor 1 and the monitoring/voltage supply conductor 10 are described as being connected to each other through one or more resistors of 0Ω, they may alternatively be connected through a wiring pattern. In this case, when the voltage supply conductor 2 becomes unusable due to deterioration by aging or the occurrence of abnormality, the wiring pattern between the monitoring conductor 1 and the monitoring/voltage supply conductor 10 is cut off and the resistor Ru of 0Ω is connected so that the voltage Vx is applied to the monitoring/voltage supply conductor 10.

The fifth embodiment of the deterioration state detection means 100 shown in FIG. 7 is described as being configured so that the monitoring/voltage supply conductor 10 is added to the third embodiment. However, this configuration is also applicable to the first embodiment (FIG. 1A and FIG. 1B), the second embodiment (FIG. 3), the third embodiment (FIG. 4A and FIG. 4B), and the fourth embodiment (FIG. 5).

Figure 8:
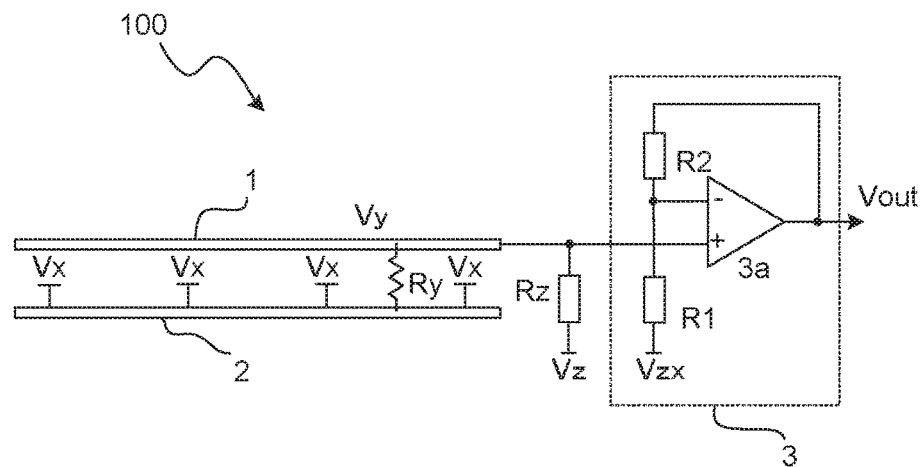
FIG. 8 is a schematic diagram of the sixth embodiment of the deterioration state detection means of the printed circuit board deterioration detection device of the present invention.

FIG. 8 is a schematic diagram of the sixth embodiment of the deterioration state detection means 100. The sixth embodiment differs from the first embodiment shown in FIG. 1A in that a voltage supplied to the monitoring conductor 1 through resistor is Vz (Vx>Vz) lower than the voltage Vx supplied to the voltage supply conductor 2 and that the resistor R1 of the amplifier circuit 3 is connected to Vzx.

The relationships between Vx, Vz, and 0 V may be given by any of the following inequalities:
Vx>Vz≥0 V,
Vx≥0 V>Vz, and
0 V>Vx>Vz.

Here Vzx is a given voltage including 0V.

The voltage Vy of the monitoring conductor 1 (voltage input to the amplifier circuit 3) according to the sixth embodiment is given by equation (5) as follows:

$$Vy=(R \cdot Vx+Ry \cdot Vz)/(R+Ry) \quad (5)$$

Here R corresponds to the resistor Rz in FIG. 8 and two or more resistors, if any, constitute a combined resistor formed of a parallel circuit.

The resistance component Ry between the monitoring conductor 1 and the voltage supply conductor 2 is given by equation (6) as follows:

$$Ry=(Vx-Vy) \cdot R/(By-Vz) \quad (6)$$

Since the relationship between the output voltage Vout of the amplifier circuit and the input voltage Vy can be expressed by equation (7) given below, the input voltage Vy can be obtained if the output voltage Vout of the amplifier circuit is ascertained. Vzx can be set independently of Vx.

$$Vy=(R1 \cdot Vout+R2 \cdot Vzx)/(R1+R2) \quad (7)$$

If R1 becomes infinite (or if R1 is not connected), Vout=Vy is given. Thus, if the output voltage Vout is monitored, both the voltage Vy of the monitoring conductor 1 (input voltage of the amplifier circuit 3) and the resistance component Ry between the monitoring conductor 1 and the voltage supply conductor 2 can be ascertained.

Figure 9:
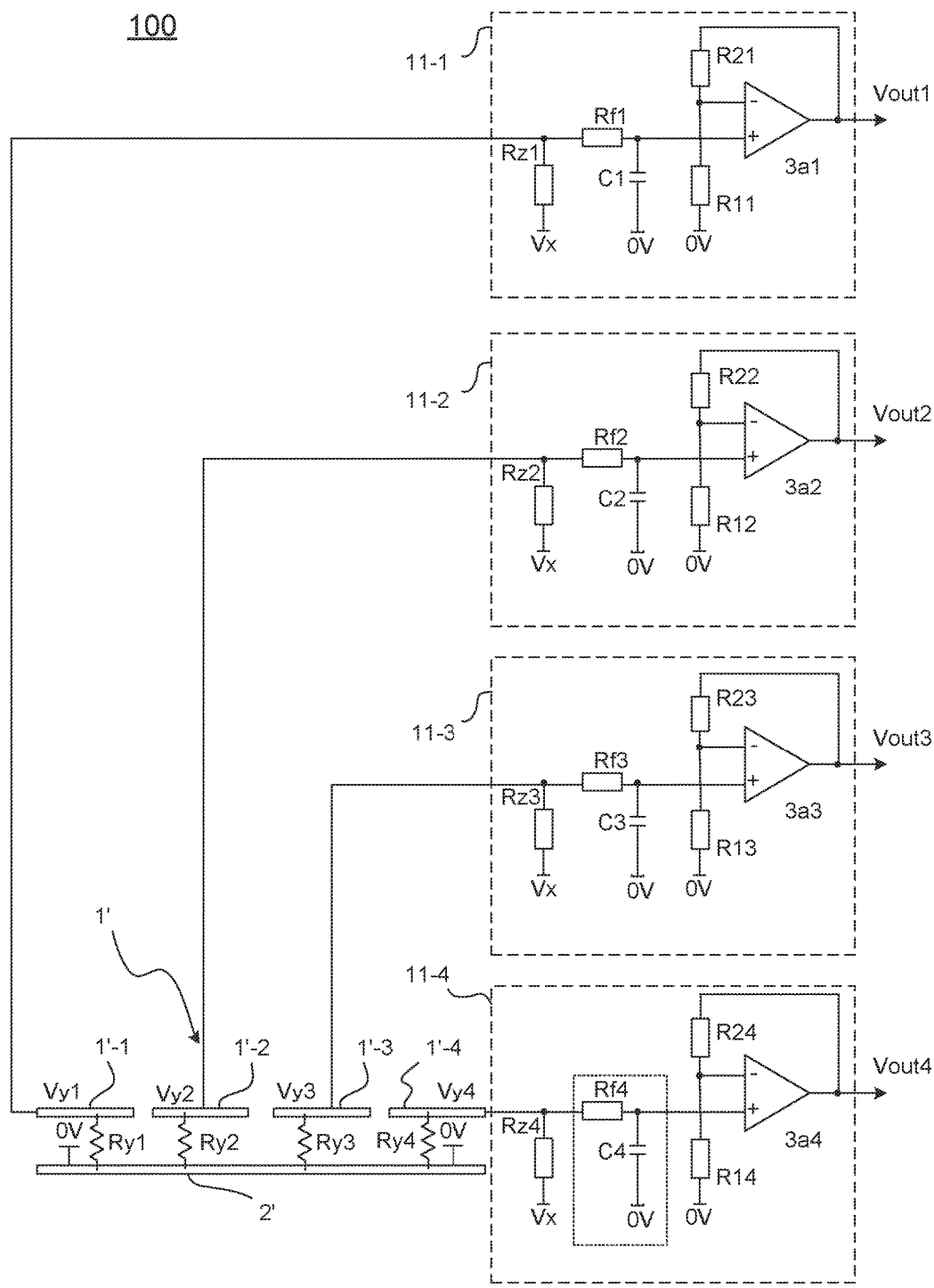
FIG. 9 is a schematic diagram of the seventh embodiment of the deterioration state detection means of the printed circuit board deterioration detection device of the present invention.

FIG. 9 is a schematic diagram of the seventh embodiment of the deterioration state detection means 100. In the seventh embodiment, a voltage receiving conductor 2' is provided in place of the voltage supply conductor 2, and a monitoring/voltage supply conductor 1' (1'-1 to 1'-4) is provided in place of the monitoring conductor 1. The monitoring/voltage supply conductor 1' is divided into a plurality of conductors 1'-1 to 1'-4. In the first to sixth embodiments described above, the voltage supply conductor 2 is formed by connecting a conductor to the source for the voltage Vx. In this seventh embodiment, the voltage receiving conductor 2' is formed by connecting a conductor to 0 V in place of the source for the voltage Vx. Moreover, the monitoring/voltage supply conductor 1' (1'-1 to 1'-4) is connected to the source for the voltage Vx through a resistor. Thus, the monitoring/voltage supply conductor 1' (1'-1 to 1'-4) and the voltage receiving conductor 2' serve as an anode (positive electrode) and a cathode, respectively. As in the third embodiment, each conductor of the monitoring/voltage supply conductor 1' (1'-1 to 1'-4) is connected with a circuit formed of a filter, amplifier circuit, and resistor for supplying the voltage Vx in a set.

In this case, only one resistor for the supply of the voltage Vx should be connected for each conductor to the monitoring/voltage supply conductor 1' (1'-1 to 1'-4), as shown in FIG. 9. This is because if a plurality of resistors are connected, the voltage Vy varies according to equation (1) before and after the breakage, if any, of the conductor between the resistors. Although the breakage can be determined based on the variation of the voltage, reuse requires preliminary storage of the breakage or some other complicated countermeasure, so that it is preferable to connect only one resistor for each conductor.

In the seventh embodiment of the deterioration state detection means 100 shown in FIG. 9, circuits 11-1 to 11-4 formed of filters, amplifier circuits, and resistors for supplying the voltage Vx are individually connected in sets to the conductors (totally four sets of circuits are included) of the monitoring/voltage supply conductor 1' (1'-1 to 1'-4).

The circuit 11-1, for example, comprises a resistor Rz1, one and the other ends of which are connected to the source for the voltage Vx and the monitoring/voltage supply conductor 1'-1, respectively, a filter formed of a capacitor C1 and a resistor Rf1 connected to the monitoring/voltage supply conductor 1'-1, and an amplifier circuit formed of resistors R11 and R21 and an OP amplifier 3a1 to which a voltage Vy1 of the monitoring/voltage supply conductor 1'-1 is input through the filter. The other circuits 11-2 to 11-4 are constructed in the same manner.

In the early stage of use of the printed circuit board, the deterioration of the printed circuit board is not advanced and voltages Vy1 to Vy4 of the monitoring/voltage supply conductor 1' (1'-1 to 1'-4) are close to the voltage Vx, since the voltage Vx is supplied through resistors Rz1 to Rz4. If the use of the printed circuit board is continued, on the other hand, insulation resistances Ry1 to Ry4 between the monitoring/voltage supply conductor 1' (1'-1 to 1'-4) and the voltage receiving conductor 2' are reduced by the electrically conductive material. Thereupon, the voltages Vy1 to Vy4 of the monitoring/voltage supply conductor 1' (1'-1 to 1'-4) are reduced, and output voltages Vout1 to Vout4 of OP amplifiers 3a1 to 3a4 of amplifier circuits for amplifying the voltages Vy1 to Vy4 are also reduced. The deterioration of the printed circuit board is detected by monitoring the output voltages Vout1 to Vout4 of the amplifier circuits. The monitoring/voltage supply conductor 1' serves as the anode, so that the monitoring/voltage supply conductor 1' (1'-1 to 1'-4) may possibly be broken if the printed circuit board is deteriorated. Since the plurality of (four in the example of 9) circuits 11-1 to 11-4 of the monitoring/voltage supply conductor 1' (1'-1 to 1'-4) are connected to the plurality of (four in the example of 9) conductors, the deterioration detection function can be maintained despite the breakage of the monitoring/voltage supply conductor 1'. Although the four sets are used in the example of FIG. 9, the sets may alternatively be three or less or five or more in number.

Figure 10:
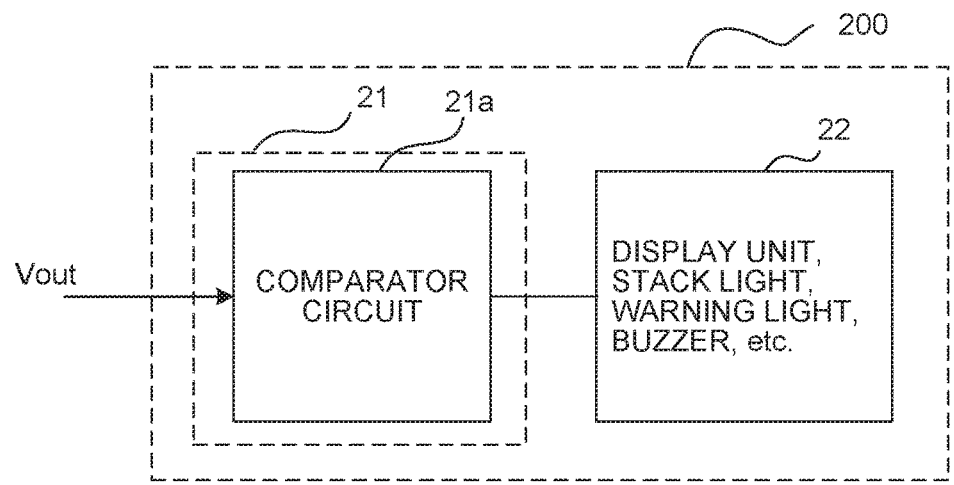
FIG. 10 is a schematic diagram of the first embodiment of a deterioration determination detection/alarm means of the printed circuit board deterioration detection device of the present invention.

FIG. 10 is a schematic diagram of the first embodiment of a deterioration determination detection/alarm means, which determines whether or not the printed circuit board is deteriorated, based on the output voltage Vout of the deterioration state detection means 100 (i.e. the output of the amplifier circuit) and outputs the deterioration detection signal to produce an alarm or the like if it is determined that the printed circuit board is deteriorated. The output of the deterioration state detection means 100 of each of the above-described embodiments (i.e. output of the amplifier circuit 3) is input to this deterioration determination detection/alarm means 200.

The deterioration determination detection/alarm means 200 of this embodiment comprises the deterioration determination detection means 21 and an alarm output means 22, the deterioration determination detection means 21 comprising a comparator circuit 21a. The output voltage Vout of the deterioration state detection means 100 (i.e. the output voltage of the amplifier circuit) is input to the comparator circuit 21a of the deterioration determination detection means 21, whereupon the comparator circuit 21a compares the output voltage Vout and a reference voltage for determining the deterioration. If the output voltage Vout is deviated from the range of the reference voltage, the deterioration detection signal is output to the alarm output means 22. The alarm output means 22 comprises a display, a stack light, a warning light, or a buzzer. If the deterioration detection signal is output from the deterioration determination detection means 21, the alarm output means 22 displays "REPLACE OR CLEAN DETERIORATED PRINTED CIRCUIT BOARD AND CHECK CASE BODY FOR TIGHTNESS." or the like on the display, turns on the stack light, or sounds the buzzer.

In the case where the deterioration state detection means 100 of the fourth embodiment shown in FIG. 5 is used as the deterioration state detection means 100, the logic output of the voltage/current supply circuit 9 is turned off by the deterioration detection signal output from the deterioration determination detection means 21 (i.e. a signal output from the comparator circuit 21a).

If the deterioration state detection means 100 is constructed according to the third embodiment (FIG. 4A and FIG. 4B), the fourth embodiment (FIG. 5), the fifth embodiment (FIG. 7), and the seventh embodiment (FIG. 9), it has a plurality of output voltages Vout (outputs of the amplifier circuits 3), and the output voltages Vout depend on the properties of the amplifier circuits 3. Therefore, the output voltages Vout of the deterioration state detection means 100 (i.e. outputs of the amplifier circuits 3) are selected to connect the comparator circuit 21a, and reference values are set in accordance with the properties of the amplifier circuits. Alternatively, the comparator circuit 21a may be provided for each of the output voltages Vout of the deterioration state detection means 100 (i.e. outputs of the amplifier circuits 3) or the comparator circuit 21a for taking out the deterioration detection signal may be selected.

Figure 11:
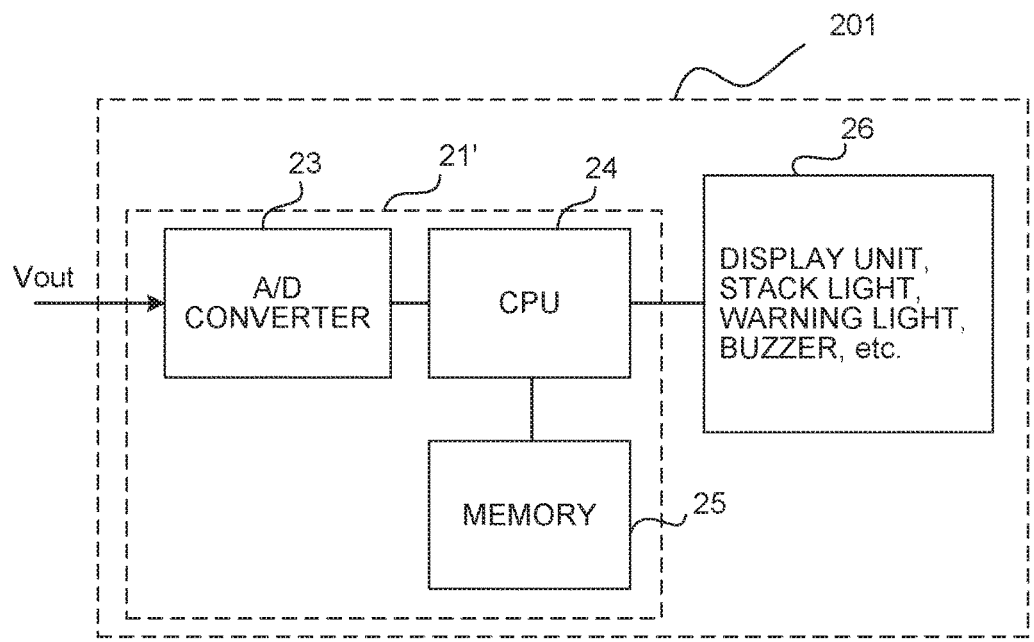
FIG. 11 is a schematic diagram of the second embodiment of the deterioration determination detection/alarm means of the printed circuit board deterioration detection device of the present invention.

FIG. 11 is a schematic diagram of the second embodiment of the deterioration determination detection/alarm means. The deterioration determination detection/alarm means 201 of the second embodiment comprises a deterioration determination detection means 21' and an alarm output means 26. The deterioration determination detection means 21' comprises the A/D converter (analog-to-digital voltage converter) 23, the processor 24, and the memory (e.g., flash ROM, power-backed-up RAM, or EEPROM) 25. The output voltage Vout of the deterioration state detection means 100 (i.e. the output voltage of the amplifier circuit 3) is input to the A/D converter 23 and converted to a digital value. The processor 24 performs the later-described processing at arbitrary intervals and determines or detects whether or not the printed circuit board is deteriorated, based on the digitally converted value of the output voltage Vout or the like. If it is determined that the printed circuit board is deteriorated, the deterioration detection signal is output to the alarm output means 26.

On receiving the deterioration detection signal, the alarm output means 26, which comprises a display, a stack light, a warning light, or a buzzer, provides a warning indication by displaying a message, turning on the stack light, or sounding the buzzer.

The deterioration determination detection means 21' of the deterioration determination detection/alarm means 201 of the second embodiment is configured to output a plurality of types of deterioration detection signals, based on three factors, i.e., the time (duration) from the start of use of the printed circuit board to the current time, the magnitude of the output voltage Vout of the deterioration state detection means 100 (i.e. the output voltage of the amplifier circuit), and the time-based variation of the output voltage Vout, and cause the alarm output means 26 to produce messages corresponding to the signals.

Figure 12:
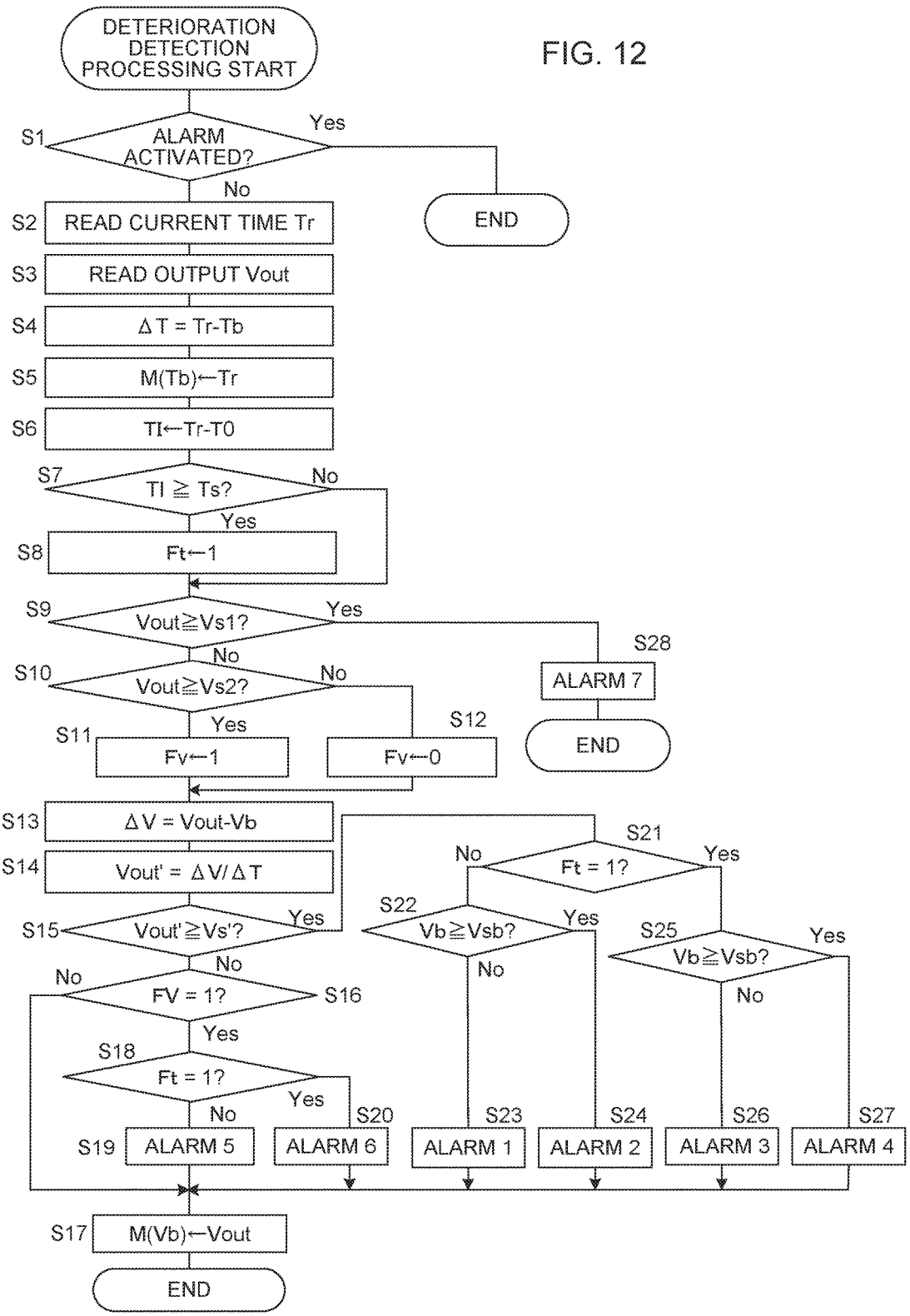
FIG. 12 is a flowchart showing an algorithm of printed circuit board deterioration detection processing performed by a processor of the deterioration determination detection/alarm means of the second embodiment.

FIG. 12 is a flowchart showing an algorithm of printed circuit board deterioration detection processing performed by the processor 24 of the deterioration determination detection/alarm means 201 of the second embodiment. The processor 24 performs this processing at predetermined intervals or at a predetermined timing. The processing shown in FIG. 12 is based on the assumption that the deterioration state detection means 100 of the first embodiment (FIG. 1A and FIG. 1B), the second embodiment (FIG. 3), or the sixth embodiment (FIG. 8) is used as the deterioration state detection means 100 for detecting the signal indicative of the deterioration state of the printed circuit board. The deterioration state detection means 100 of these embodiments comprises only one amplifier circuit 3 for amplifying and outputting the voltage Vy of the monitoring conductor 1 and outputs only one output voltage Vout.

The processor 24 determines whether or not an alarm is activated (Step S1). If an alarm is activated, this processing ends. If not, a current time Tr is read by a clock means (Step S2) and data obtained by converting the output voltage Vout of the deterioration state detection means 100 (i.e. the output voltage of the amplifier circuit 3) to a digital value by the A/D converter is read (Step S3). Then, the time Tb stored in a storage unit M(Tb) in the memory 25 for storing the time of execution of the previous deterioration detection processing is subtracted from the current time Tr to obtain an elapsed time ΔT from the previous deterioration detection processing to the current deterioration detection processing (Step S4). The current time Tr read in Step S2 is loaded into the storage unit M(Tb) and stored as the time Tb at which the previous deterioration detection processing is performed and thus stored time Tbis to be used in the next processing (Step S5). Moreover, a printed circuit board use start time (operation start time of an electronic device equipped with the printed circuit board) TO is subtracted from the current time Tr obtained in Step S2 to obtain a use duration TI (Step S6) of the printed circuit board. The printed circuit board use start time TO is stored as initial setting in the memory 25 at the start of use of the printed circuit board.

Then, the printed circuit board duration TI and a reference duration Ts preset for determining the deterioration based on the printed circuit board duration TI are compared (Step S7). If the printed circuit board duration TI is equal to or longer than the reference duration Ts, a prolonged-use flag Ft is set to "1" (Step S8), whereupon the processing proceeds to Step S9. If the printed circuit board duration TI is shorter than the reference duration Ts, in contrast, the processing proceeds to Step S9 without setting the prolonged-use flag Ft to "1". The prolonged-use flag Ft is assumed to be set to "0" in the initial setting at the start of use of the printed circuit board. If the decision in Step S7 is No, a step of setting the prolonged-use flag Ft to "0" may be added.

In Step S9, it is determined whether or not the output voltage Vout read in Step S3 is equal to or higher than the first reference value Vs1 previously set and stored for determining the deterioration. If the output voltage Vout is equal to or higher than the first reference value Vs1, an alarm 7 as the deterioration detection signal is output (Step S28), and the alarm output means 26 displays on its display unit "PRINTED CIRCUIT BOARD PATTERN IS AFFECTED BY ELECTRICALLY CONDUCTIVE MATERIAL (INCLUDING MIGRATION). REPLACE OR CLEAN PRINTED CIRCUIT BOARD OR REMOVE ELECTRICALLY CONDUCTIVE MATERIAL AT ONCE. MAKE POORLY SEALED CASE BODY TIGHTER." or the like, turns on the stack light, or sounds the buzzer, whereupon this processing ends.

The first reference value Vs1 is set to the value of the output voltage Vout corresponding to the voltage Vy substantially equal to and slightly lower than the voltage Vx applied to the voltage supply conductor 2 and is provided on the assumption that the monitoring conductor 1 and the voltage supply conductor 2 are short-circuited by any metallic substance or migration.

If the output voltage Vout of the deterioration state detection means 100 is lower than the first reference value Vs1, the processing proceeds from Step S9 to Step S10, in which it is determined whether or not the output voltage Vout is equal to or higher than the second reference value Vs2. This second reference value Vs2 is set to such a value that the occurrence or probability of abnormality should be identified (first reference value Vs1>second reference value Vs2). If the output voltage Vout is determined to be equal to or higher than the second reference value Vs2, an abnormal-voltage flag Fv is set to "1" (Step S11). If the output voltage Vout is lower than the second reference value Vs2, the abnormal-voltage flag Fv is set to "0" (Step S12).

Subsequently, the output voltage Vout detected at the time of the previous deterioration detection processing and stored in a storage unit M(Vb) (this previous output voltage Vout is denoted by Vb) is subtracted from the current output voltage Vout read in Step S2 (current output voltage Vout−Vb (=previous Vout)) to obtain a difference ΔV (=current Vout−Vb (=previous Vout)) between the output voltages at the previous and current times of deterioration detection processing (Step S13).

The output voltage difference ΔV is divided by the elapsed time ΔT from the previous deterioration detection processing to the current deterioration detection processing obtained in Step S4 to obtain a time-based variation Vout' of the output voltage (Step S14). The output voltage variation Vout' and a preset reference value Vs' of the voltage variation are compared (Step S15). If the output voltage variation Vout' is lower than the voltage variation reference value Vs', the processing proceeds to Step S16, and it is determined whether or not the abnormal-voltage flag Fv is set to "1". If the flag Fv is not set to "1", the currently input output voltage Vout is lower than the second reference value Vs2, the output voltage variation Vout' is also lower than the voltage variation reference value Vs', and no substantial change had occurred. Thus no abnormality is ascertained, and the currently read output voltage Vout is loaded into the storage unit M(Vb) and stored as the previous output Vout for the next processing (Step S17), then terminate the processing.

If it is determined in Step S16 that the abnormal-voltage flag Fv is set to "1", in contrast, it is determined whether or not the prolonged use flag Ft is set to "1". If the flag Ft is not set to "1", an alarm 5 is output as the deterioration detection signal (Step S19). If the flag Ft is set to "1", an alarm 6 is output as the deterioration detection signal (Step S20), whereupon the processing proceeds to Step S17, in which the currently read output voltage Vout is loaded into the storage unit M(Vb). Thereupon, this processing ends.

The alarm 5 is output in the case where the time-based variation Vout' of the output voltage is not high, the output voltage Vout is equal to or higher than the second reference value Vs2, and the elapsed time from the start of operation is short. In this case, it can be assumed that the insulation resistance Ry between the monitoring conductor 1 and the voltage supply conductor 2 is rapidly reduced, so that "REPLACE OR CLEAN PRINTED CIRCUIT BOARD AT ONCE. ALSO CHECK PROBABLY POORLY SEALED CASE BODY FOR TIGHTNESS AND MAKE IT TIGHTER." or the like is displayed on the display, the stack light is turned on, or the buzzer is sounded.

The alarm 6 is output in the case where the output voltage variation Vout' is not high, the output voltage Vout is equal to or higher than the second reference value Vs2, and the elapsed time from the start of operation is long. In this case, it can be assumed that the insulation resistance Ry between the monitoring conductor 1 and the voltage supply conductor 2 is gradually reduced, so that "REPLACE OR CLEAN PRINTED CIRCUIT BOARD AT ONCE. ALSO CHECK CASE BODY FOR TIGHTNESS." or the like is displayed on the display, the stack light is turned on, or the buzzer is sounded.

If it is determined in Step S15 that the output voltage variation Vout' is equal to or higher than the voltage variation reference value Vs', in contrast, it is determined whether or not the prolonged use flag Ft is set to "1" (Step S21). If the flag Ft is not set to "1", it is determined whether or not the output voltage Vb (=previously detected output voltage Vout) stored in the storage unit M(Vb) is equal to or higher than the third reference value Vsb (the second reference value Vs2>the third reference value Vsb; the third value had been set to determine whether or not output voltage Vout is relatively low or high, though not abnormal) (Step S22). If the output voltage Vb is lower than the third reference value Vsb, the time-based variation Vout' of the output voltage is equal to or higher than the reference value, the elapsed time from the start of operation is short, and the previous output voltage Vout (=Vb) is lower than the third reference value Vsb, so that it can be assumed that the tightness of the case body is poor from the beginning. Therefore, an alarm 1 is output as the deterioration detection signal such that "REPLACE OR CLEAN PRINTED CIRCUIT BOARD AT ONCE. ALSO CHECK PROBABLY POORLY SEALED CASE BODY FOR TIGHTNESS AND MAKE IT TIGHTER." or the like is displayed on the display, the stack light is turned on, or the buzzer is sounded (Step S23).

Moreover, if the prolonged use flag Ft is set to "0" (Step S21) and the output voltage Vb (=previous output voltage Vout) is equal to or higher than the third reference value Vsb (Step S22), the time-based variation Vout' of the output voltage is equal to or higher than the reference value, the elapsed time from the start of operation is short, and the output voltage Vb (=previous output voltage Vout) is equal to or higher than the third reference value Vsb, so that it can be assumed that the tightness of the case body is very poor from the beginning, for example. Therefore, an alarm 2 is output as the deterioration detection signal such that "REPLACE OR CLEAN PRINTED CIRCUIT BOARD AT ONCE. ALSO MAKE POORLY SEALED CASE BODY TIGHTER AT ONCE." or the like is displayed on the display, the stack light is turned on, or the buzzer is sounded (Step S24).

Furthermore, if it is determined in Step S21 that the prolonged use flag Ft is set to "1", it is determined whether or not the output voltage Vb (=previous output voltage Vout) is equal to or higher than the third reference value Vsb (Step S25). If the output voltage Vb (=previous output voltage Vout) is lower than the third reference value Vsb, the time-based variation Vout' of the output voltage is equal to or higher than the reference value, the elapsed time from the start of operation is long, and the output voltage Vb (=previous output voltage Vout) is lower than the third reference value Vsb, so that it can be assumed that the tightness of the case body is suddenly reduced, for example. Therefore, an alarm 3 is output as the deterioration detection signal such that "REPLACE OR CLEAN PRINTED CIRCUIT BOARD AT ONCE. ALSO CHECK PROBABLY POORLY SEALED CASE BODY FOR TIGHTNESS." or the like is displayed on the display, the stack light is turned on, or the buzzer is sounded (Step S26).

If it is determined in Step S25 that the output voltage Vb (=previous output voltage Vout) is equal to or higher than the third reference value Vsb, the time-based variation Vout' of the output voltage is equal to or higher than the reference value, the elapsed time from the start of operation is long, and the output voltage Vb (=previous output voltage Vout) is equal to or higher than the third reference value Vsb, so that it can be assumed that the tightness of the case body is gradually reduced or the use is continued with the case body not very tight. Therefore, an alarm 4 is output as the deterioration detection signal such that "REPLACE OR CLEAN PRINTED CIRCUIT BOARD AT ONCE. ALSO CHECK CASE BODY FOR TIGHTNESS." or the like is displayed on the display, the stack light is turned on, or the buzzer is sounded (Step S27). After the alarms 1 to 4 are output in this manner, the currently read output voltage Vout is loaded into the storage unit M(Vb) and stored as the previous output Vb for the next processing (Step S17), whereupon this processing ends.

While alarm processing has been described above, the display contents are given by way of example only, and it is to be understood that they may be replaced with other display contents. Moreover, if it is inappropriate to "display a message on the display, turn on the stack light, or sound the buzzer", the display contents may be stored in a storage means for a serviceman's operation or the like such that the contents displayed on the display can be checked.

Furthermore, although data on the previous time and voltage in the storage unit M have been described as being replaced by data on the current time and voltage, the data on the voltage and the like may be stored for each time. By doing this, the time-based changes of the voltage and the like can be identified, so that the data can also be processed as big data and detailed determination can be expected. Although one reference value has been described as being used in each of Step S15 and its subsequent steps, it is be understood that two reference values may be used in each step.

If a liquid or the like adheres to the device so that the time-based variation Vout' of the output voltage is increased more over that of the previous time, there is a possibility of the variation Vout' being reduced at the next time (because the difference ΔV is small if the change of a current is small even though the current continues to flow due to electrolytic corrosion), the display should preferably be bolded on unless the output voltage Vout is varied substantially (or unless cleaning or the like is performed).

Moreover, in the case where the deterioration state detection means 100 of the third embodiment (FIG. 4A and FIG. 4B), the fourth embodiment (FIG. 5), or the seventh embodiment (FIG. 9), which comprises a plurality of amplifier circuits 3 for amplifying and outputting the voltage Vy of the monitoring conductor 1, is used as the deterioration state detection means 100, the first reference value Vs1, the second reference value Vs2, the third reference value Vsb, and the voltage variation reference value Vs' corresponding to each of the amplifier circuits 3 should previously be stored in the memory 25. When the output voltage Vout of the amplifier used for the printed circuit board deterioration detection processing is selected, according to this arrangement, the first reference value Vs1, second reference value Vs2, and voltage variation reference value Vs' stored corresponding to the selected amplifier can be read and used for the printed circuit board deterioration detection processing.

In the case where the deterioration state detection means 100 of the seventh embodiment (FIG. 9) is used, it is when the voltage Vy of the monitoring conductor 1 is reduced that abnormality is produced. Therefore, the decisions to be made in Steps S9 and S10 on the printed circuit board deterioration detection processing shown in FIG. 12 will be those on whether or not the output voltage is equal to or lower than the reference values (Vout≤Vs1, Vout≤Vs2), and the output voltage difference ΔV is obtained by subtracting the currently detected output voltage from the previously detected output voltage (Vb−Vout=ΔV) in Step S13.

Furthermore, after the alarm is raised, the value in the storage unit M(Vb) is ascertained as required, the printed board is cleaned, the output voltage to be stored in the storage unit M(Vb) is rewritten to the post-cleaning output voltage Vout and saved (post-cleaning Vout can easily be noticed from equations (1) and (3) by measuring the insulation resistance between the monitoring conductor 1 and the voltage supply conductor 2 by means of, for example, a tester without any actual operation), and the alarm state is released to enable the reuse.

While embodiments of the present invention have been described herein, the invention is not limited to the above-described embodiments and may be suitably modified and embodied in various forms.

The invention claimed is:

1. A deterioration detection device for detecting deterioration of a printed circuit board in an electronic device, the deterioration detection device comprising:
   a deterioration state detection unit including
      a monitoring conductor for detecting deterioration, and
      a voltage supply conductor for supplying voltage arranged on the printed circuit board at a distance from the monitoring conductor, wherein
         the voltage supply conductor is applied a given voltage by a voltage source through a plurality of points,
         the monitoring conductor is applied, from the voltage supply conductor and through a resistance between the monitoring conductor and the voltage supply conductor, a voltage lower than that applied to the voltage supply conductor, and
         a variation of the voltage from the monitoring conductor is detected as an output signal indicative of a deterioration state of the printed circuit board; and
   a deterioration determination detection unit configured to
      determine and detect the deterioration state of the printed circuit board, based on the output signal of the deterioration state detection unit, and
      output a deterioration detection signal,
   wherein the deterioration state detection unit comprises one or more amplifier circuits connected to the monitoring conductor such that an output or outputs of the amplifier circuit or circuits are regarded as the output of the deterioration state detection unit.

2. The deterioration detection device according to claim 1, wherein the voltage supply conductor is connected to any voltage source at a plurality of points, and the monitoring conductor is supplied with a voltage lower than that of the voltages source through one or more resistors.

3. The deterioration detection device according to claim 1, wherein the voltage applied to the monitoring conductor through the resistors is 0 V when a use of the printed circuit board is started.

4. The deterioration detection device according to claim 1, wherein resists covering the monitoring conductor and the voltage supply conductor are partially or wholly omitted.

5. The deterioration detection device according to claim 4, wherein the resists and the circuit board are brought into close contact with one another at conductor-free parts of the conductors formed by removing parts thereof under the resists covering the monitoring conductor and the voltage supply conductor.

6. The deterioration detection device according to claim 1, wherein the plurality of amplifier circuits connected to the monitoring conductor are set with different amplification degrees.

7. The deterioration detection device according to claim 1, wherein the voltage source for supplying the voltage to the voltage supply conductor comprises a voltage supply circuit configured to stop the voltage supply for a predetermined time period when the deterioration detection signal is detected.

8. The deterioration detection device according to claim 1, wherein the deterioration determination detection unit comprises a comparator circuit configured to output the deterioration detection signal in response to an output voltage of the output signal from the deterioration state detection unit being deviated from a reference voltage range.

9. The deterioration detection device according to claim 1, wherein
   the deterioration determination detection unit comprises one or more comparator circuits connected individually to the one or more amplifier circuits of the deterioration state detection unit, and
   each of the one or more comparator circuits compares an output voltage of the amplifier circuit connected thereto and a reference voltage and outputs the deterioration detection signal in response to the output voltage being deviated from a reference voltage range.

10. The deterioration detection device according to claim 1, wherein the deterioration determination detection unit is configured to
   read an output voltage Vout of the output signal of the deterioration state detection unit and a current time Tr at each predetermined time interval or at each predetermined timing,
   obtain a time-based variation Vout' of the output voltage based on a time duration from the start of use of the printed circuit board and differences between previously and currently read output voltages and times, and
   output a resulting detection signal based on a combination of the magnitude of factors for determining the deterioration state of the printed circuit board, including the time-based variation Vout' of the output voltage, the read output voltage Vout, and the duration from the start of use.

11. The deterioration detection device according to claim 1, wherein the deterioration determination detection unit comprises
   a processor configured to
      read the output voltage Vout of the output signal of the deterioration state detection unit and the current time Tr at each predetermined time interval or at each predetermined timing,
      obtain a duration TI from the start of use from the read current time and a preset use start time of the printed circuit board,
      calculate an elapsed time ΔT from previous reading from the read current time and the previously read time stored in a storage unit,
      obtain a difference voltage ΔV between the read output voltage Vout and a previously read output voltage Vb stored in the storage unit,
      obtain a time-based variation Vout' of the output voltage by dividing the difference voltage ΔV by the elapsed time ΔT, the storage unit is configured to individually store the read output voltage Vout and the current time Tr, compare/determine the read output voltage Vout and a preset reference voltage value, compare/determine the duration TI from the start of use and a preset reference duration, compare/determine the time based variation Vout' of the output voltage and a preset reference variation, and output a deterioration detection signal based on a combination of the results of the determination.

12. The deterioration detection device according to claim 10, further comprising an alarm output unit for outputting an alarm or a message depending on the type of the deterioration detection signal.

13. A deterioration detection device for detecting deterioration of a printed circuit board in an electronic device, the deterioration detection device comprising:
   a deterioration state detection unit including
      a monitoring conductor for detecting deterioration and
      a voltage supply conductor for supplying voltage arranged on the printed circuit board at a distance from the monitoring conductor, wherein
         the voltage supply conductor is applied a given voltage by a voltage source through a plurality of points,
         the monitoring conductor is applied, from the voltage supply conductor and through a resistance between the monitoring conductor and the voltage supply conductor, a voltage lower than that applied to the voltage supply conductor, and
         a variation of the voltage from the monitoring conductor is detected as an output signal; and
   a deterioration determination detection unit configured to determine and detect the deterioration state of the voltage supply conductor, based on the output signal of the deterioration state detection unit, and
      output a deterioration detection signal,
wherein
   the deterioration state detection unit further comprises a third conductor formed as a further monitoring conductor and as a further voltage supply conductor, in addition to the monitoring conductor and the voltage supply conductor, and the third conductor is arranged on the printed circuit board at a distance from the monitoring conductor, and
   the monitoring conductor and the third conductor are connected to each other to have the same voltage in such a manner that the monitoring conductor and the third conductor are disconnected from each other upon deteriorated the voltage supply conductor to allow the voltage applied to the voltage supply conductor to be connected to the third conductor, thereby constituting the deterioration state detection unit.

14. A deterioration detection device for detecting deterioration of a printed circuit board in an electronic device, the deterioration detection device comprising:
   a deterioration state detection unit including
      a voltage receiving conductor, and
      a monitoring-and-voltage supplying conductor arranged on the printed circuit board at a clear distance from the voltage receiving conductor, the monitoring-and-voltage supplying conductor being formed as a monitoring conductor for detecting deterioration and as a voltage supply conductor for supplying voltage,
         the voltage receiving conductor is connected to a voltage source,
         the monitoring-and-voltage supplying conductor is divided into a plurality of conductors, each of which is supplied, from a further voltage source and through a resistor, with a voltage higher than the voltage of the voltage source, and
         a variation of the voltage from the monitoring-and-voltage supplying conductor is detected as an output signal indicative of a deterioration state of the printed circuit board; and
   a deterioration determination detection unit configured to determine and detect the deterioration state of the printed circuit board, based on the output signal of the deterioration state detection unit, and
      output a deterioration detection signal.

* * * * *